(12) United States Patent
Wu et al.

(10) Patent No.: US 9,082,801 B2
(45) Date of Patent: Jul. 14, 2015

(54) ROTATABLE LOCATING APPARATUS WITH DOME CARRIER AND OPERATING METHOD THEREOF

(71) Applicant: Industrial Technology Research Institute, Hsinchu (TW)

(72) Inventors: Pei-Shan Wu, New Taipei (TW);
Kuan-Chou Chen, Hsinchu (TW);
Sheng-Lang Lee, Hsinchu (TW);
Fu-Ching Tung, Hsinchu (TW);
Chia-Ming Chen, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 305 days.

(21) Appl. No.: 13/711,631

(22) Filed: Dec. 12, 2012

(65) Prior Publication Data

US 2014/0059836 A1    Mar. 6, 2014

(30) Foreign Application Priority Data

Sep. 5, 2012 (TW) .............................. 101132323 A

(51) Int. Cl.
*H01L 21/67* (2006.01)
*H01L 21/68* (2006.01)
*H01L 21/687* (2006.01)
*C23C 14/50* (2006.01)

(52) U.S. Cl.
CPC .............. *H01L 21/68* (2013.01); *C23C 14/505* (2013.01); *H01L 21/68764* (2013.01); *H01L 21/68771* (2013.01); *Y10T 29/49998* (2015.01)

(58) Field of Classification Search
CPC ..... C23C 14/505; H01L 21/68; H01L 21/682; H01L 21/683; H01L 21/287; H01L 21/68771; H01L 21/68764; Y10T 29/4998
See application file for complete search history.

(56) References Cited

U.S. PATENT DOCUMENTS

| | | | | |
|---|---|---|---|---|
| 5,188,501 | A * | 2/1993 | Tomita et al. | 414/416.08 |
| 5,520,501 | A * | 5/1996 | Kouno et al. | 414/741 |
| 5,885,054 | A * | 3/1999 | Kato et al. | 414/783 |
| 5,931,518 | A * | 8/1999 | Pirker | 294/119.1 |
| 7,033,445 | B2 * | 4/2006 | Keeton et al. | 118/725 |
| 7,167,805 | B2 | 1/2007 | Saeki et al. | |
| 7,541,061 | B2 * | 6/2009 | Ramsay | 427/248.1 |

(Continued)

FOREIGN PATENT DOCUMENTS

| | | |
|---|---|---|
| JP | 62295839 | 12/1987 |
| JP | 62295840 | 12/1987 |

(Continued)

*Primary Examiner* — Alexander P Taousakis
(74) *Attorney, Agent, or Firm* — Jianq Chyun IP Office

(57) ABSTRACT

A rotatable locating apparatus including a fixing base, a rotatable rack, a first driving module, a carrier, and a second driving module is provided. The rotatable rack is pivoted on the fixing base through a first rotation axis. The first driving module is coupled to the rotatable rack to drive the rotatable rack rotating with respect to the fixing base along the first rotation axis. The carrier is provided with accommodating slots on an arc surface of the carrier, and the carrier is pivoted on the rotatable rack through a second rotation axis. The second rotation axis passes through a curvature center of the arc surface and is perpendicular to the first rotation axis. The curvature center is located on the first rotation axis. The second driving module is coupled to the carrier to drive the carrier rotating with respect to the rotatable rack along the second rotation axis.

23 Claims, 7 Drawing Sheets

(56) References Cited

U.S. PATENT DOCUMENTS

| | | | |
|---|---|---|---|
| 8,022,448 B1 * | 9/2011 | Luu et al. | 257/288 |
| 8,030,725 B1 * | 10/2011 | Luu et al. | 257/443 |
| 8,086,348 B2 * | 12/2011 | Alberti et al. | 700/228 |
| 2002/0002422 A1 | 1/2002 | Kondo et al. | |
| 2009/0194024 A1 * | 8/2009 | Burrows et al. | 118/712 |
| 2010/0272893 A1 * | 10/2010 | Chang et al. | 427/255.5 |
| 2011/0049779 A1 * | 3/2011 | Egami et al. | 269/289 R |
| 2012/0107072 A1 | 5/2012 | Watanabe | |

FOREIGN PATENT DOCUMENTS

| | | |
|---|---|---|
| TW | 429506 | 4/2001 |
| TW | 523164 | 3/2003 |
| TW | 525628 | 3/2003 |
| TW | 547486 | 8/2003 |
| TW | 200625434 | 7/2006 |
| TW | 201029101 | 8/2010 |

* cited by examiner

ROTATABLE LOCATING APPARATUS WITH DOME CARRIER AND OPERATING METHOD THEREOF

CROSS-REFERENCE TO RELATED APPLICATION

This application claims the priority benefit of Taiwan application serial no. 101132323, filed on Sep. 5, 2012. The entirety of the above-mentioned patent application is hereby incorporated by reference herein and made a part of this specification.

TECHNICAL FIELD

The invention relates to a rotatable locating apparatus with a dome carrier and an operating method thereof.

BACKGROUND

With an increased density of semiconductor devices of integrated circuits, the accuracy and manufacturing efficiency of a manufacturing process is relatively important. A few errors occurred in the manufacturing process of a semiconductor are likely to lead to the failure of the manufacturing process, causing damage to devices (such as semiconductor or light emitting diode wafers) and consequently consuming a great amount of cost.

Take thermal evaporation as an example, which utilizes a resistor or an electron beam to heat a film-coating material (such as Copper, Cu) in a crucible and evaporate the film-coating material to accomplish thin film deposition, wherein compounds are evaporated through heating and attached to surface of a wafer or a sample.

Taking the cost of film-coating into consideration, a carrier for an evaporator is mostly in a dome shape. Currently a wafer is retrieved by labors in the industry, which demands extra staff training costs. Moreover, with an increased size of the wafer (for example, the size of a light emitting diode wafer has increased to 4-6 inches) and a tendency to thinning the wafer, retrieving the wafer with by labors not only takes a lot of time but also risks damaging the wafer. If a mechanical arm is used for automatic wafer retrieval, the mechanical arm needs a flexible movement capability with high degrees of freedom so as to meet a requirement for arc surface locating, which leads to an increased difficulty and configuration cost in designing the mechanical arm.

SUMMARY

The present application provides a rotatable locating apparatus including a fixing base, a rotatable rack, a first driving module, a carrier, and a second driving module. The rotatable rack is pivoted on the fixing base through a first rotation axis. The first driving module is disposed on the fixing base and is coupled to the rotatable rack to drive the rotatable rack rotating with respect to the fixing base along the first rotation axis. The carrier is provided with a plurality of accommodating slots on an arc surface, and the carrier is pivoted on the rotatable rack through a second rotation axis. The second rotation axis passes through a curvature center of the arc surface and is perpendicular to the first rotation axis. The curvature center is located on the first rotation axis. The second driving module is disposed on rotatable rack and is coupled to the carrier to drive the carrier rotating with respect to the rotatable rack along the second rotation axis.

Based on the rotatable locating apparatus, a following operating method can be carried out, including: driving the rotatable rack rotating with respect to the fixing base along the first rotation axis via the first driving module and driving the carrier rotating with respect to the rotatable rack along the second rotation axis via the second driving module to move the plurality of accommodating slots on the carrier move to a same position in sequence.

Based on the rotatable locating apparatus, another following operating method can be carried out, including: (1) driving the carrier rotating a first rotating angle with respect to the rotatable rack along the second rotation axis via the second driving module and the first rotating angle corresponds to an interval between two accommodating slots on a same circular trace; (2) repeating step (1) to move all the accommodating slots on the same concentric circular trace to a same position in sequence; (3) driving the rotatable rack rotating a second rotating angle with respect to the fixing base along the first rotation axis via the first driving module and the second rotating angle corresponds to an interval between two concentric circular traces, to move one of the accommodating slots on another concentric circular trace to the same position; and (4) repeating steps (1) to (2).

Based on the above, the present application helps the carrier move via rotations along two axes, to keep any accommodating slot on the carrier in a fixed position relation with a working platform at a specific time.

In order to make the aforementioned features of the invention more comprehensible, embodiments accompanying figures are described in detail below.

DESCRIPTION OF EMBODIMENTS

A rotatable locating apparatus and an operating method thereof provided in the present application are suitable for a variety of semiconductor manufacturing process or a light emitting diode manufacturing process requiring arc surface locating, for example semiconductor evaporation or light emitting diode wafer evaporation, for moving a wafer on the carrier to a same retrieval position to achieve arc surface locating.

Figure 1:
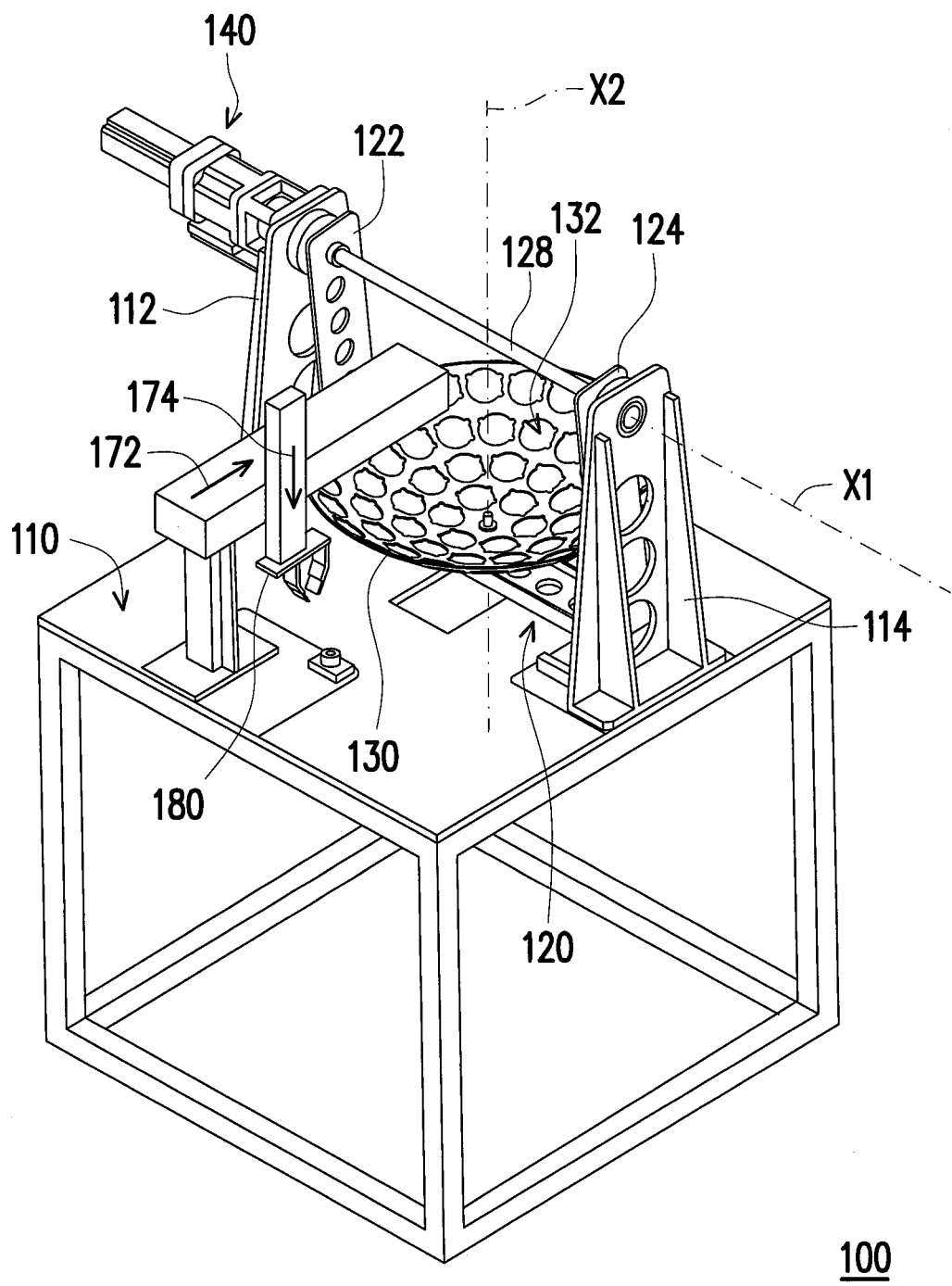
FIG. 1 illustrates a rotatable locating apparatus according to an embodiment of the present application.
Figure 2:
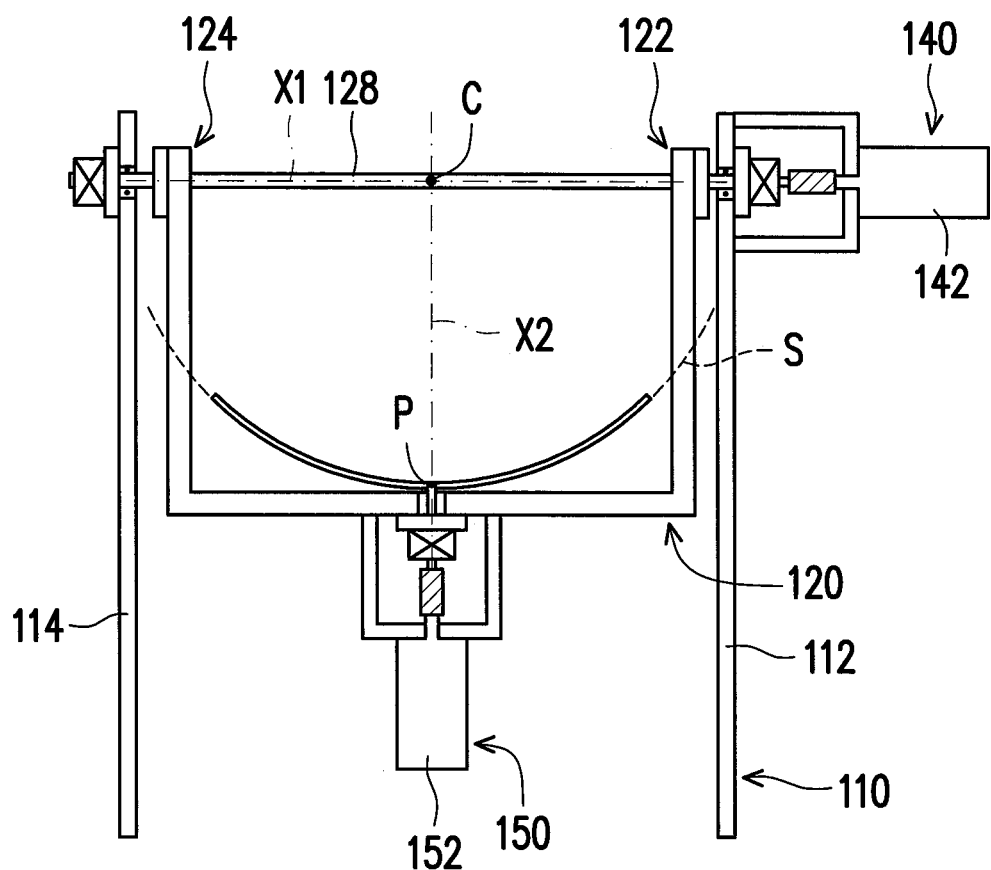
FIG. 2 is a cross-sectional schematic view of the rotatable locating apparatus in FIG. 1.

FIG. 1 illustrates a rotatable locating apparatus according to an embodiment of the present application. FIG. 2 is a sectional schematic view of the rotatable locating apparatus in FIG. 1. As shown in FIGS. 1 and 2, the rotatable locating apparatus 100 includes a fixing base 110, a rotatable rack 120, a carrier 130, a first driving module 140, and a second driving module 150. The fixing base 110 is a member part providing a stable support such as a foundation base of a working table for a manufacturing process, a machine stand of a delivering facility, and etc. The rotatable rack 120 is pivoted on the fixing base 110 through a first rotation axis X1. The first driving module 140 is disposed on the fixing base 110 and is coupled to the rotatable rack 120 to drive the rotatable rack 120 rotating with respect to the fixing base 110 along the first rotation axis X1.

To be specific, the fixing base 110 in the embodiment includes two parallel fixing holders 112 and 114 respectively erected at two opposite sides of the rotatable rack 120. Two ends 122 and 124 of the rotatable rack 120 are coupled to the fixing holders 112 and 114 via a linking axial pole 128 so as to increase rotational stiffness and locating accuracy of the rotatable rack 120. The rotatable rack 120 is in, for example, a U shape as shown in FIG. 2 or in other possible shapes such as a dome shape. The first driving module 140, for example, includes a servomotor 142 to which an end of the linking axial pole 128 is coupled, so as to drive the linking axial pole 128 turning via the servomotor 142 and to further help the rotatable rack 120 rotate along the first rotation axis X1.

The carrier 130 in the embodiment is pivoted above the rotatable rack 120 through a second rotation axis X2. The second driving module 150 is disposed under the rotatable rack 120 and is coupled to the carrier 130. The second driving module 150 may include a servomotor 152 via which the carrier 130 is driven to rotate with respect to the rotatable rack 120 along the second rotation axis X2.

As shown in FIG. 1, a retrieving component 180 is disposed at one side of the carrier 130 and can perform biaxial linear movement along directions 172 and 174 to clamp a device from the carrier 130 or to place the device on the carrier 130. The retrieving component 180 may be a clamp claw, a sucking disc, or other similar components.

Figure 3:
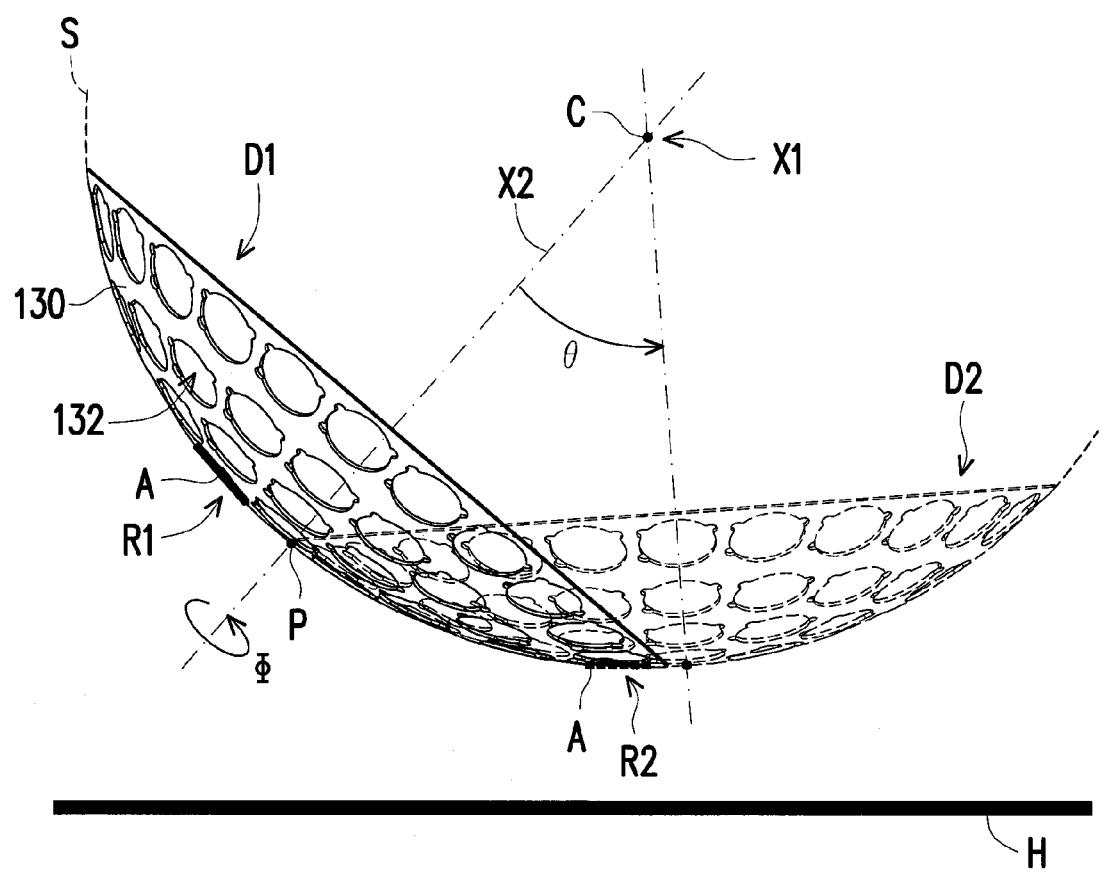
FIG. 3 is a schematic view illustrating operation of the carrier in FIG. 1.

FIG. 3 is a working schematic view of the carrier 130. As shown in FIGS. 1-3, the carrier 130 is provided with a plurality of accommodating slots 132 and is in, for example, a dome shape so that the accommodating slot 132 is located on an arc surface S. That is, a central point of the accommodating slot 132 is located on the arc surface S. Certainly, in other embodiments, the carrier 130 may not be in a dome shape, such as a square carrier providing an arc-shaped mounting surface only at a local region or other types of carriers allowing the accommodating slots to be distributed along the arc surface.

In the embodiment, take a wafer carrier as an example, when a wafer is placed in the accommodating slot 132, the wafer is in parallel with a plane which passes through the central point of the accommodating slot 132 and is tangent to the arc surface S. The second rotation axis X2 passes through a curvature center C of the arc surface S and is perpendicular to the first rotation axis X1 (perpendicular to a direction of the drawing surface). Besides, the curvature center C is located on the first rotation axis X1.

Accordingly, the embodiment drives the rotatable rack 120 revolving along the first rotation axis X1 via the first driving module 140 and drives the carrier 130 rotating itself along the second rotation axis X2 via the second driving module 150, so as to structure a rotation locating pattern under a spherical coordinate system. For example, the curvature center C of the arc surface S is used as an origin of the spherical coordinate system (r, θ, Φ). When the rotatable rack 120 revolves along the first rotation axis X1, a θ coordinate (zenith angle) of the accommodating slot 132 of the carrier 130 can be changed, as shown in FIG. 3, and the θ coordinate moves from a D1 position to a D2 position. When the carrier 130 rotates itself along the second rotation axis X2, a Φ coordinate (azimuth angle) of the accommodating slot 132 can be changed. In other words, each accommodating slot 132 on the arc surface S can be moved to a specific position on the arc surface S through adjusting the θ coordinate and the Φ coordinate so that the retrieving component 180 can perform retrieving actions.

Locating the wafer carrier in an evaporation process is used as an example in the following paragraphs to specify an operating method of achieving arc surface locating by applying the rotatable locating apparatus 100.

Figure 4:
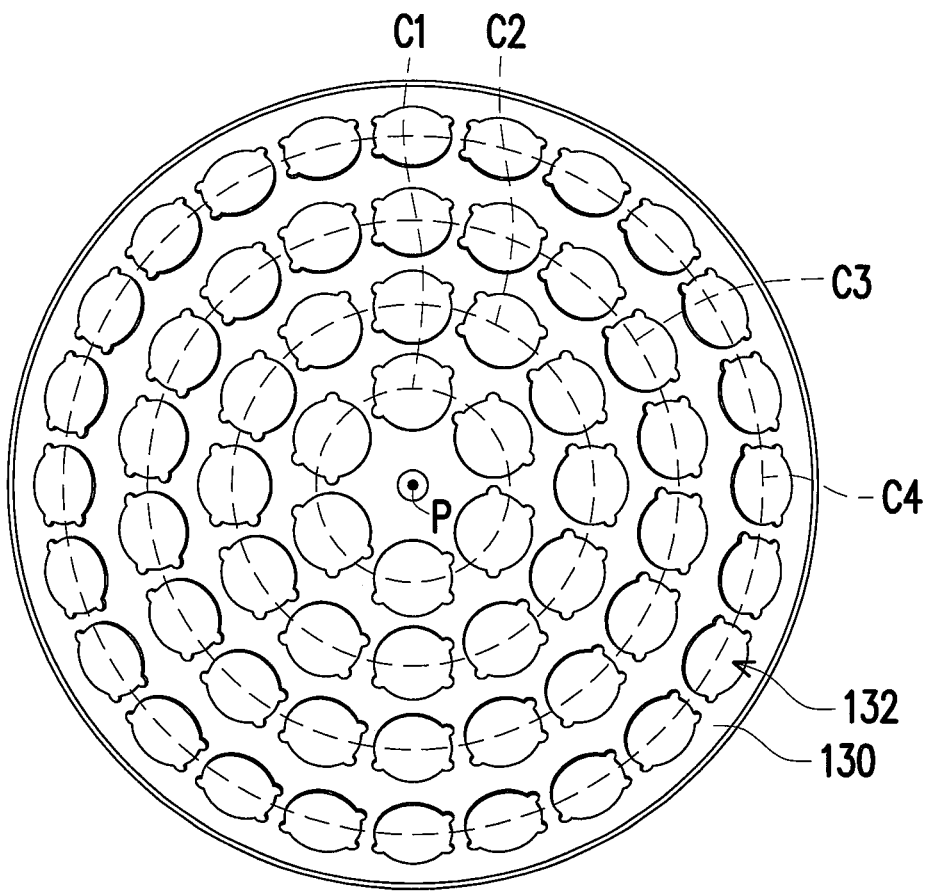
FIG. 4 illustrates a front view of a wafer carrier according to an embodiment of the present application.

FIG. 4 illustrates a front view of a wafer carrier according to an embodiment of the present application. In the embodiment, a carrier 130 with a 60-chip wafer loading capacity having 60 accommodating slots 132 for placing the wafer is used as an example. Here, the design of the accommodating slot 132 on the carrier 130 varies according to the way the wafer is retrieved. For example, the carrier may be a front-load wafer carrier or a rear-load wafer carrier. The second rotation axis X2 passes through a rotation center P of the carrier 130 and the accommodating slot 132 is arranged along at least one circular trace which has the rotation center P as its center. For example, the 60 accommodating slots 132 in the embodiment are arranged along four concentric circular traces C1-C4 which have the rotation center P of the carrier 130 as their center, from the inside to the outside, wherein 6 chips of wafer can be placed in the most inner circle (first circle), 12 chips of wafer can be placed in the second circle, 18 chips of wafer can be placed in the third circle, and 24 chips of wafer can be placed in the fourth circle.

As shown in FIG. 3, since the carrier 130 has the arc surface S, any point on the arc surface S is at a fixed distance from the curvature center C. Therefore, in the wafer delivery process, the carrier 130 revolves and rotates itself along the curvature center C so that any of the accommodating slots 132 on the carrier 130 maintains a fixed position relation with a working platform in a period of time. In the embodiment, the fixed position relation is defined as that a plane A of any accommodating slot 132 for placing the wafer can be in parallel with a working platform H in a period of time, i.e. locating at a position where the retrieving component 180 retrieves the devices. When delivering the wafer, the retrieving component 180 moves perpendicularly or horizontally to retrieve the wafer without performing a complex three dimensional movement.

In addition, no matter the carrier 130 adopts the front-load design or the rear-load design, the difference lies in a wafer placement direction when locating is performed. In other words, with the ideas provided in the present application, both of the carrier designs allow the plane A of any accommodating slot 132 on the carrier 130 for placing the wafer to be in parallel with the working platform H. The wafer placement direction can be simplified as placement from above the carrier or placement from under the carrier 130.

In order for the plane A of the accommodating slot 132 for placing the wafer to be in parallel with the working platform H, the carrier 130 needs to revolve and rotates itself along the curvature center C. In the embodiment, a connecting line between the rotating center P of the carrier 130 and the curvature center C is the second axis rotation X2 and the first rotation axis X1 is perpendicular to the second rotation axis X2 and passes through the curvature center C. Please refer to FIG. 3. Therefore, when the carrier 130 revolves along the first rotation axis X1 to rotate one angle (zenith angle θ), the carrier 130 is moved from the position D1 to the position D2. Moreover, one certain plane A of the accommodating slot 132 on the carrier 130 for placing the wafer is moved from a position R1 to a position R2 which is in parallel with the working platform H. In addition, in order for each plane A of the accommodating slot 132 on the carrier 130 for placing the wafer to be moved to locating and to be in parallel with the working platform H, the carrier 130 further rotates along the second rotation axis X2.

Here, a value of a plurality of rotating angles θ can be defined according to a number of the circular traces and intervals between the circular traces formed in the arrangement of the accommodating slot 132 on the carrier 130. For example, a rotation of the carrier 130 along the first rotation axis X1 is corresponded to a value (revolution) of the rotating angle θ of a interval between the two circular traces so that one of the accommodating slots 132 on the circular trace is moved to a position of another accommodating slot 132 on the circular trace to achieve the locating on the θ coordinate (zenith angle) carried out via revolution. On the other hand, the carrier 130 can rotate an Φ angle (rotation) along the second rotation axis X2, wherein a degree of the Φ angle is in a range from 0 degree to 360 degrees since the accommodating slots 132 are on full circumference of the circular trace. A value of the rotating Φ angle corresponds to a interval between the two accommodating slots on the same circular trace so that one accommodating slot 132 on the same circular trace is moved to a position of another accommodating slot 132 so as to achieve the locating on the Φ coordinate (azimuth angle) carried out via rotation.

FIGS. 5A-5F are further used to describe an operating method for achieving arc surface locating in the embodiment. Firstly, please refer to FIGS. 5A and 5B. When the wafer is retrieved beginning from accommodating slot (K1-1) in the most inner circle on the carrier 130, the carrier 130 rotates an initial rotating angle α1 along the first rotation axis X1 and then the accommodating slot (K1-1) is moved to locating. A plane of the accommodating slot (K1-1) at the position for loading the wafer is in parallel with the working platform H. Next, the carrier 130 rotates an angle 131 along the second rotation axis X2, and then accommodating slot (K1-2) is moved to locating. In the embodiment, accommodating slots from (K1-1) through (K1-6) in the most inner circle are arranged into six equal parts of the full circumference, i.e. arranged at an equal interval. Therefore, β1 is 60 degrees in the embodiment. Moreover, values of the rotating angle Φ between the accommodating slot (K1-2) and accommodating slot (K1-3), between the accommodating slot (K1-3) and accommodating slot (K1-4), between the accommodating slot (K1-4) and accommodating slot (K1-5), and between the accommodating slot (K1-5) and accommodating slot (K1-6) are also 60 degrees. The aforementioned steps are repeated like this so that the accommodating slots from (K1-1) through (K1-6) in the most inner circle are located in sequence.

Figure 5A:
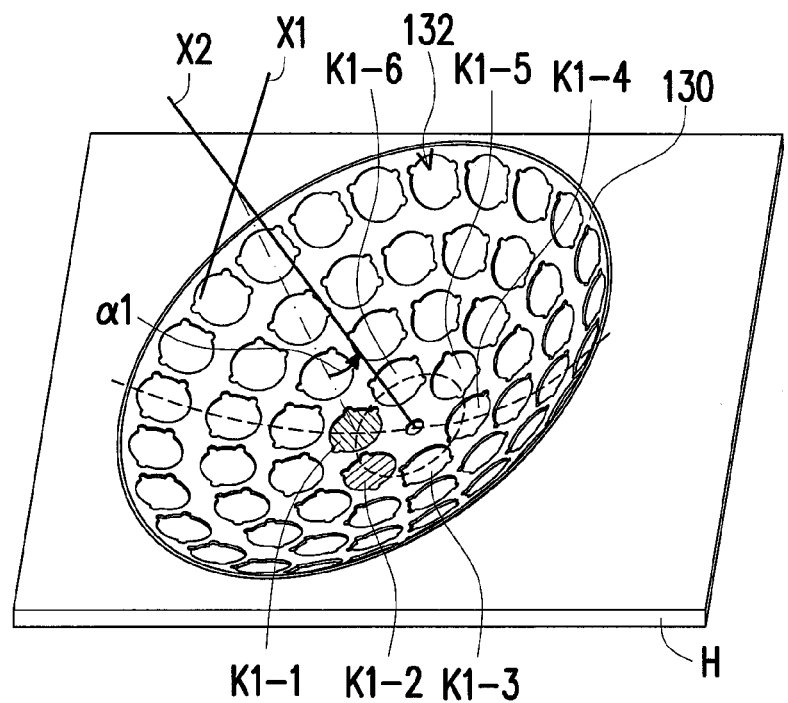
FIGS. 5A-5F illustrate a locating method according to an embodiment of the present application.
Figure 5B:
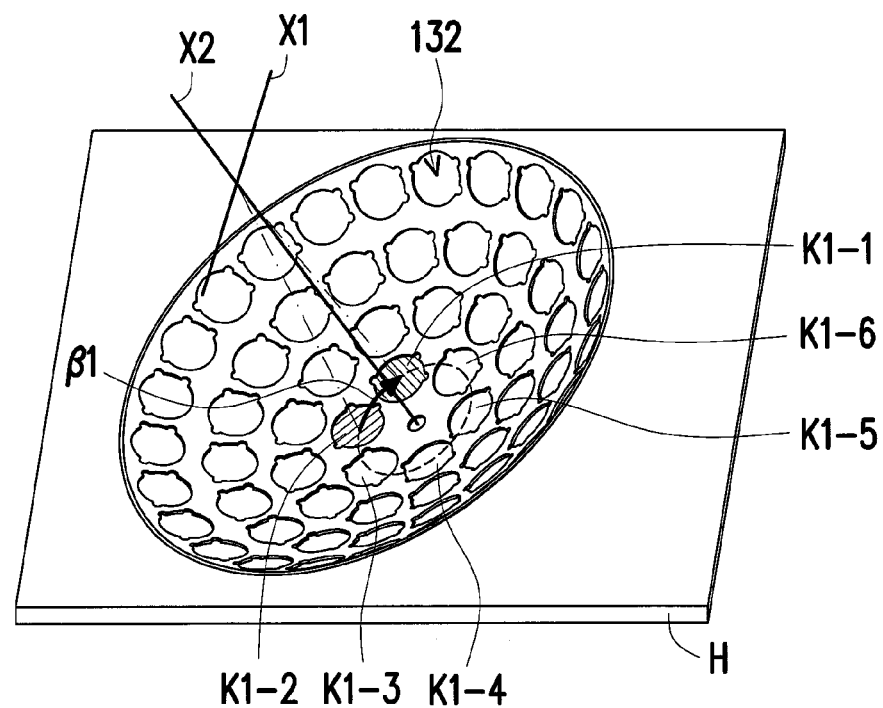
Figure 5C:
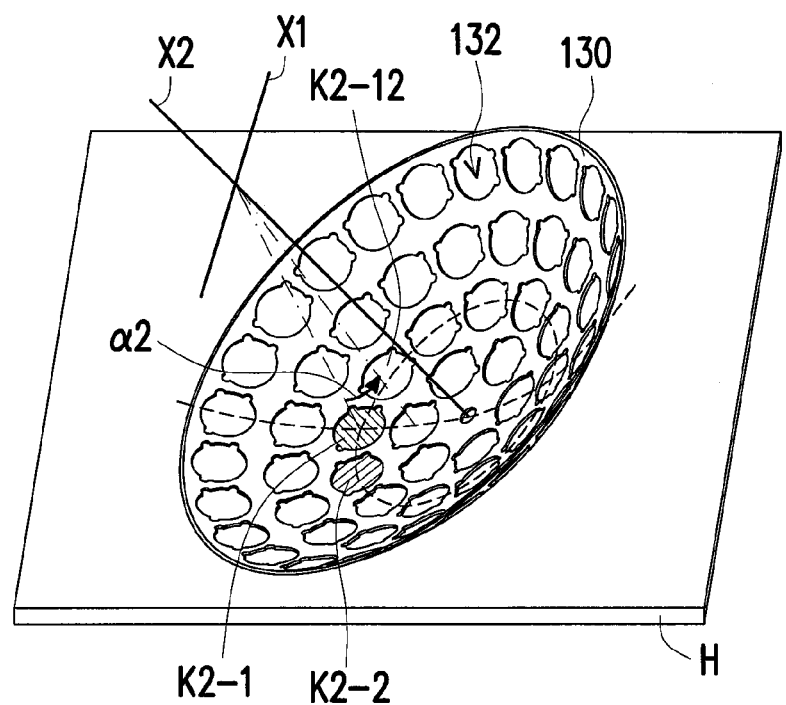
Figure 5D:
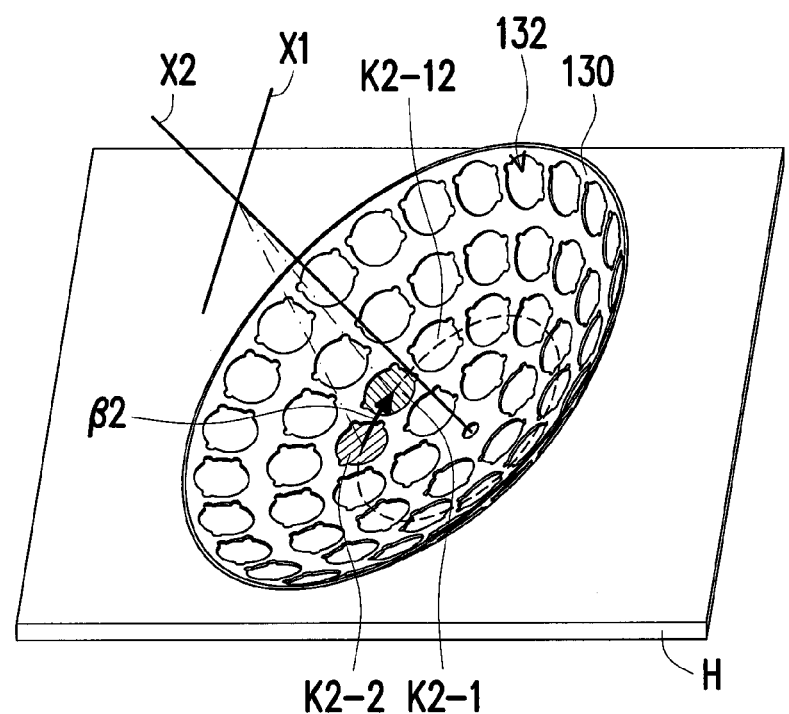

Then, please refer to FIGS. 5C and 5D. After the retrieval of the wafer in the most inner circle on the carrier 130 is completed, the carrier 130 rotates an angle α2 along the first rotation axis X1 and then an accommodating slot (K2-1) is moved to locating. A plane of the accommodating slot (K2-1) at the position for loading the wafer is in parallel with the working platform H. Next, the carrier 130 rotates an angle 132 along the second rotation axis X2 and then an accommodating slot (K2-2) is moved to locating. Likewise, in the embodiment, accommodating slots from (K2-1) through (K2-12) at the second circle are arranged in twelve equal parts of the full circumference. Therefore, β2 is 30 degrees in the embodiment, and corresponding rotating angles Φ between the rest of adjacent accommodating slots from (K2-1) through (K2-12) are also 30 degrees.

Figure 5E:
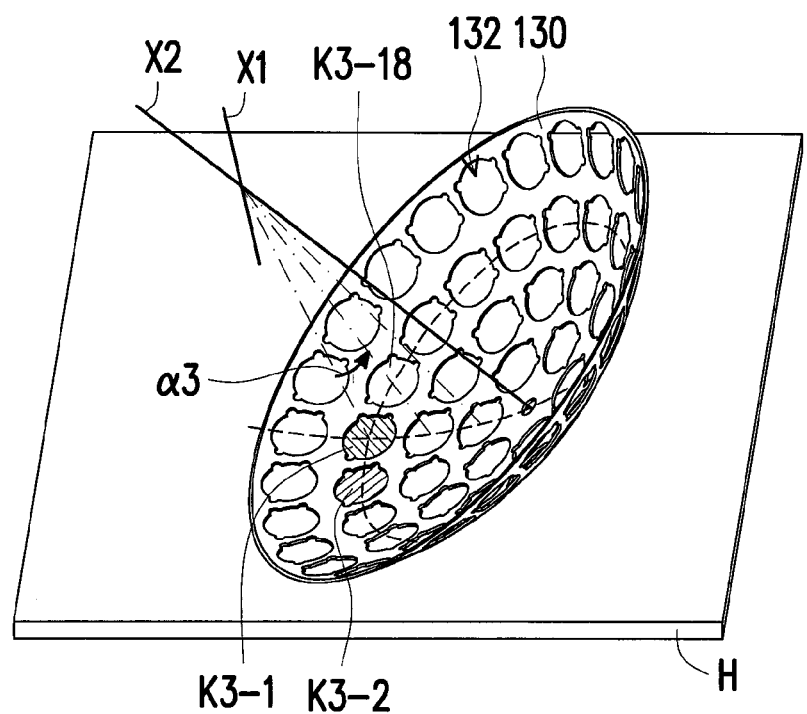
Figure 5F:
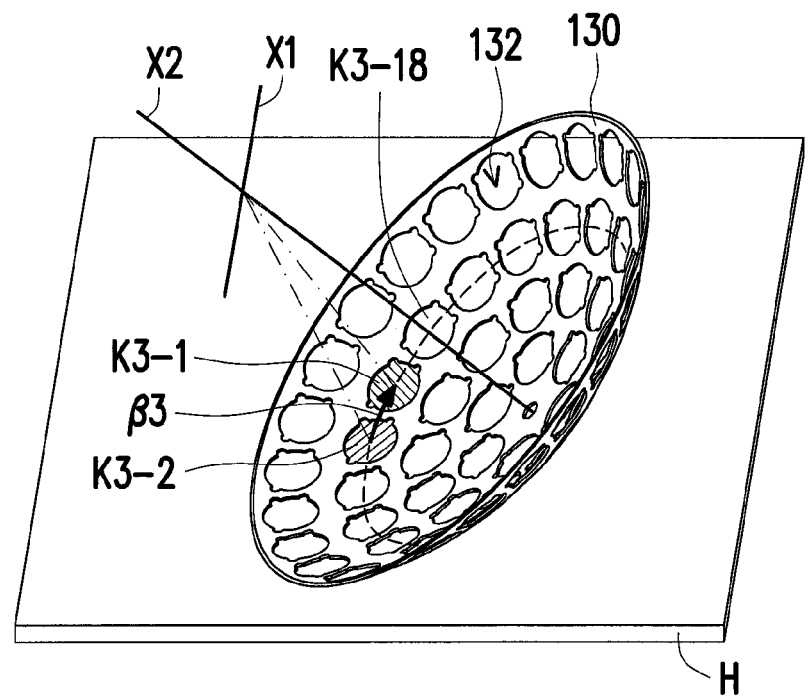

Then, please refer to FIGS. 5E and 5F. When a wafer at the third circle on the carrier 130 is to be retrieved, the carrier 130 rotates an angle α3 along the first rotation axis X1. Then an accommodating slot (K3-1) is moved to locating. A plane of the accommodating slot (K3-1) at the position for loading the wafer is in parallel with the working platform H. Next, the carrier 130 rotates an angle β3 along the second rotation axis X2, and then an accommodating slot (K3-2) is moved to locating. In the embodiment, accommodating slots from (K3-1) through (K3-18) at the third circle are arranged at eighteen equal parts of the full circumference. Therefore, β3 is 20 degrees in the embodiment and corresponding rotating angles Φ between the rest of adjacent accommodating slots from (K3-1) through (K3-18) are also 20 degrees. Likewise, accommodating slots 132 at the most outer circle on the carrier 130 can be located by the same steps mentioned above.

The present application provides no limitation to the number of the accommodating slots 132 on the carrier 130, the number of the circular traces, the interval between two adjacent accommodating slots 132, and the interval between two adjacent circular traces. Although the accommodating slots 132 at the same circle in the above embodiments are arranged at an equal interval, the interval between the accommodating slots 132 can be adjusted according to actual needs. For example, the accommodating slots 132 can have different intervals in between. Correspondingly, locating can be achieved through adjusting a corresponding rotating angle Φ of each interval. In addition, it can be selected to arrange the plurality of circular traces at an equal interval or at different intervals. When the plurality of circular traces are arranged at an equal interval, then values α1, α2, and α3 of the rotating angle θ equal to one and another. Similarly, the interval between the circular traces can be adjusted depending on actual needs. Correspondingly, locating can be achieved through adjusting the rotating angle θ corresponding to each interval.

A fixed position relation between any accommodating slot on the carrier and the working platform can be maintained at a specific time through the revolution and rotation of the carrier 130 along two axes X1 and X2 through the rotatable locating apparatus 100 and the operating method thereof provided in the above embodiments. For example, when the wafer is retrieved from the accommodating slot, wafers in different accommodating slots are moved to the same position in parallel with the working platform to achieve arc surface locating. Accordingly, a mechanical arm having a complex design and with a multi-axes movement is no longer required for the delivery between the wafer and the carrier 130. The wafer is picked up (or placed) from a feeding (or gathering) position via the retrieving component 180 as shown in FIG. 1 with a fixed route (such as uniaxial or biaxial linear movement).

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A rotatable locating apparatus, comprising:
    a fixing base;
    a rotatable rack, pivoted on the fixing base through a first rotation axis;
    a first driving module, disposed on the fixing base and coupled to the rotatable rack to drive the rotatable rack rotating with respect to the fixing base along the first rotation axis;
    a carrier, provided with a plurality of accommodating slots which are located on an arc surface of the carrier, the carrier pivoted to the rotatable rack through a second rotation axis, wherein the second rotation axis passes through a curvature center of the arc surface and is perpendicular to the first rotation axis, and the curvature center is located on the first rotation axis; and a second driving module, disposed on the rotatable rack, and coupled to the carrier to drive the carrier rotating with respect to the rotatable rack along the second rotation axis.

2. The rotatable locating apparatus according to claim 1, wherein the fixing base includes two fixing holders respectively erected at two opposite sides of the rotatable rack, and each fixing holder is pivoted to the rotatable rack.

3. The rotatable locating apparatus according to claim 1, wherein the second rotation axis passes through a rotating center of the carrier, and the plurality of accommodating slots arranged along at least one circular trace which has the rotating center as its center.

4. The rotatable locating apparatus according to claim 3, wherein every two adjacent accommodating slots on the same circular trace are spaced in the same interval.

5. The rotatable locating apparatus according to claim 3, wherein two adjacent accommodating slots on the circular trace are spaced in an interval different from that of another two adjacent accommodating slots on the same circular trace.

6. The rotatable locating apparatus according to claim 3, wherein the plurality of accommodating slots are arranged along a plurality of concentric circular traces.

7. The rotatable locating apparatus according to claim 6, wherein every two concentric circular traces are spaced in the same interval.

8. The rotatable locating apparatus according to claim 6, wherein two adjacent concentric circular traces are spaced in an interval different from that of another two adjacent concentric circular traces.

9. The rotatable locating apparatus according to claim 1, wherein the first driving module or the second driving module includes a servomotor.

10. An operating method of a rotatable locating apparatus, the rotatable locating apparatus comprising:
a fixing base;
a rotatable rack, pivoted on the fixing base through a first rotation axis;
a first driving module, disposed on the fixing base and coupled to the rotatable rack;
a carrier, provided with a plurality of accommodating slots which are located on an arc surface of the carrier, the carrier pivoted to the rotatable rack through a second rotation axis, wherein the second rotation axis passes through a curvature center of the arc surface and is perpendicular to the first rotation axis, and the curvature center is located on the first rotation axis; and
a second driving module, disposed on the rotatable rack, and coupled to the carrier,
the operating method comprising:
driving the rotatable rack rotating with respect to the fixing base along the first rotation axis via the first driving module; and
driving the carrier rotating with respect to the rotatable rack along the second rotation axis via the second driving module, to move the plurality of accommodating slots on the carrier to a same position in sequence.

11. The operating method of the rotatable locating apparatus according to claim 10, further comprising clamping from or placing a device on the accommodating slot at the position via a retrieving component.

12. The operating method of the rotatable locating apparatus according to claim 10, wherein the second rotation axis passes through a rotating center of the carrier, and the plurality of accommodating slots are arranged along at least one circular trace which has the rotating center as its center, the step of driving the carrier rotating with respect to the rotatable rack along the second rotation axis via the second driving module comprising: rotating the carrier a first rotating angle corresponding to an interval between two accommodating slots on the same circular trace.

13. The operating method of the rotatable locating apparatus according to claim 12, wherein every two adjacent accommodating slots on the same circular trace are spaced in the same interval.

14. The operating method of the rotatable locating apparatus according to claim 12, wherein two adjacent accommodating slots on the circular trace are spaced in the interval different from that of another two adjacent accommodating slots on the same circular trace.

15. The operating method of the rotatable locating apparatus according to claim 12, wherein the plurality of accommodating slots are arranged along a plurality of concentric circular traces, the step of driving the rotatable rack rotating with respect to the fixing base along the first rotation axis via the first driving module comprising: rotating the carrier a second rotating angle corresponding to an interval between two adjacent concentric circular traces.

16. The operating method of the rotatable locating apparatus according to claim 15, wherein every two concentric circular traces are spaced in the same interval.

17. The operating method of the rotatable locating apparatus according to claim 15, wherein two adjacent concentric circular traces are spaced in the interval different from that of another two adjacent concentric circular traces.

18. An operating method of a rotatable locating apparatus, the rotatable locating apparatus comprising:
a fixing base;
a rotatable rack, pivoted on the fixing base through a first rotation axis;
a first driving module, disposed on the fixing base and coupled to the rotatable rack;
a carrier, provided with a plurality of accommodating slots which are located on an arc surface of the carrier, the carrier pivoted to the rotatable rack through a second rotation axis, wherein the second rotation axis passes through a rotating center of the carrier and a curvature center of the arc surface and is perpendicular to the first rotation axis, the curvature center is located on the first rotation axis, and the plurality of the accommodating slots are arranged along a plurality of concentric circular traces having the rotating center as their center; and
a second driving module, disposed on the rotatable rack, and coupled to the carrier,
the operating method comprising:
(1) driving the carrier rotating a first rotating angle with respect to the rotatable rack along the second rotation axis via the second driving module, the first rotating angle corresponding to an interval between two accommodating slots on the same concentric circular trace;
(2) repeating step (1), moving all the accommodating slots on the same circular trace to a same position in sequence;
(3) driving the rotatable rack rotating a second rotating angle with respect to the fixing base along the first rotation axis via the first driving module, the second rotating angle corresponding to an interval between two concentric circular traces, to move one of the accommodating slots on another concentric circular trace to the same position; and (4) repeating steps (1) to (2).

19. The operating method of the rotatable locating apparatus according to claim 18, wherein every two adjacent accommodating slots on the same concentric circular trace are spaced in the same interval.

20. The operating method of the rotatable locating apparatus according to claim 18, wherein two adjacent accommodating slots on the concentric circular trace are spaced in the interval different from that of another two adjacent accommodating slots on the same concentric circular trace.

21. The operating method of the rotatable locating apparatus according to claim 18, wherein every two concentric circular traces are spaced in the same interval.

22. The operating method of the rotatable locating apparatus according to claim 18, wherein two adjacent concentric circular traces are spaced in the interval different from that of another two adjacent concentric circular traces.

23. The operating method of the rotatable locating apparatus according to claim 18, further comprising driving the rotatable rack rotating an initial rotating angle with respect to the fixing base along the first rotation axis via the first driving module before step (1), so that one of the accommodating slots on the circular trace in step (1) moves to the same position.

* * * * *